United States Patent [19]

Tanaka et al.

[11] Patent Number: 4,620,161
[45] Date of Patent: Oct. 28, 1986

[54] COMPOSITE TRANSISTOR CIRCUIT

[75] Inventors: Tatsuo Tanaka; Nana Shigematsu, both of Yokohama, Japan

[73] Assignees: Kabushiki Kaisha Toshiba; Toshiba Audio Video Engineering Co., Inc., both of Japan

[21] Appl. No.: 731,980

[22] Filed: May 8, 1985

[30] Foreign Application Priority Data

May 23, 1984 [JP] Japan ................................. 59-104035

[51] Int. Cl.[4] ............................................. H03F 3/45
[52] U.S. Cl. .................................... 330/257; 330/288
[58] Field of Search ................ 330/257, 288; 323/315, 323/316

[56] References Cited

U.S. PATENT DOCUMENTS 4,380,740 4/1983 Kaplan .................................. 323/316

Primary Examiner—Gene Wan
Attorney, Agent, or Firm—Finnegan, Henderson, Farabow, Garrett & Dunner

[57] ABSTRACT

A composite transistor circuit which comprises a first current mirror circuit whose reference current circuit is connected in series to the collector of an input transistor, and a second current mirror circuit whose reference current circuit is connected between the output current circuit of the first current mirror circuit and the emitter of the input transistor.

5 Claims, 15 Drawing Figures

F I G. 10
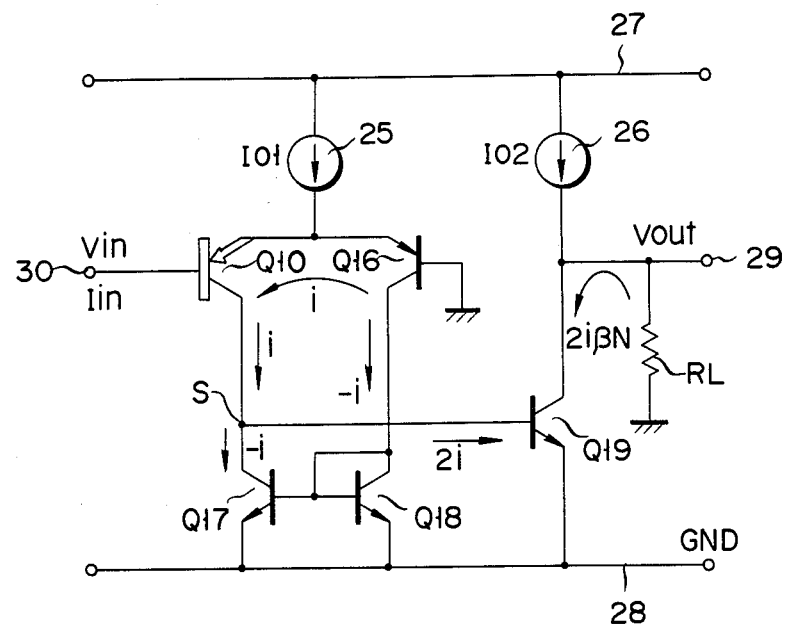
F I G. 11A
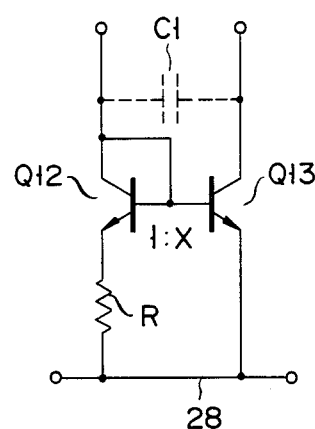
F I G. 11B
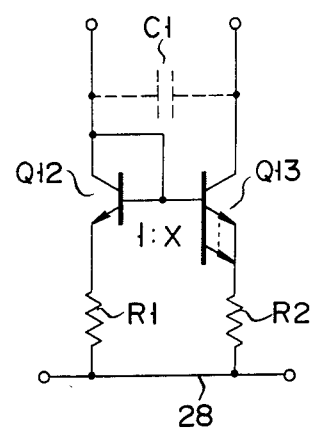

F I G. 12A  F I G. 12B
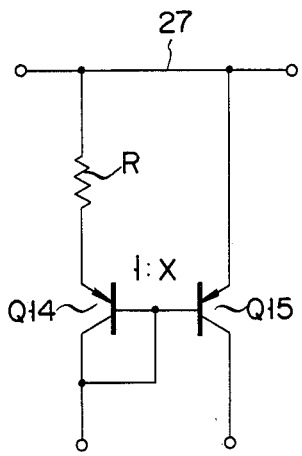
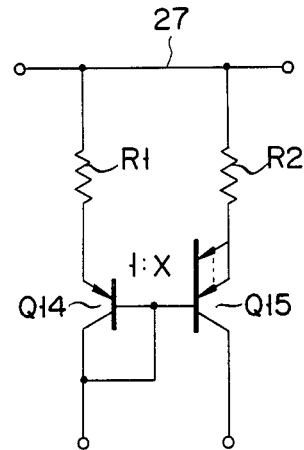
F I G. 13
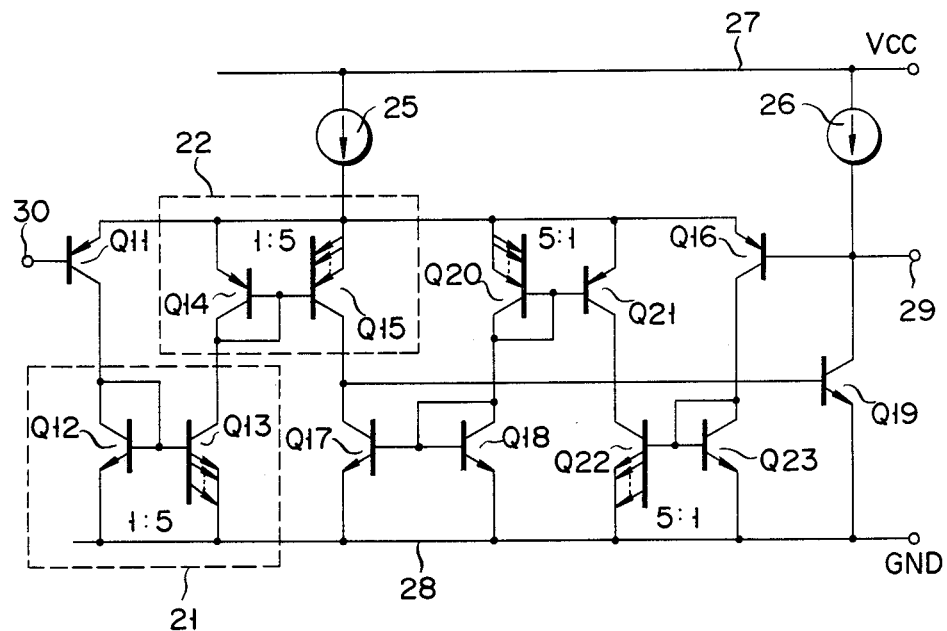

COMPOSITE TRANSISTOR CIRCUIT

BACKGROUND OF THE INVENTION

This invention relates to a composite transistor circuit, and more particularly to a transistor circuit intended to equivalently elevate the current amplification factor $\beta$.

The conventional differential amplifier consisting of PNP transistors is generally composed of a circuit shown in FIG. 1 or 2. Referring to FIG. 1, PNP transistors Q1, Q2 jointly constitute a differential transistor circuit constructed by connecting a common emitter to a reference current source 11. The bases of said PNP transistors Q1, Q2 are respectively applied as a noninverted input terminal 13 and inverted input terminal 14. Connected to the collector side of the transistors Q1, Q2 is a current mirror circuit comprising NPN transistors Q3, Q4. The collector of noninverted input transistor Q1 is connected to the base of NPN transistor Q5 constituting an emitter-grounded amplifier circuit. An output is drawn off from the collector of said transistor Q5. Numeral 12 is a reference current source, and numeral 15 is a bias terminal.

If, in the above-mentioned circuit, the transistors Q1, Q2 have low current amplification factors $\beta$, and a high resistance element RH has to be connected to the base of the transistor Q1, then the base current of the transistor Q1 causes a voltage drop across both ends of said high resistance element RH to such an extent as can not be overlooked. Therefore, care should be taken in designing the captioned composite transistor circuit. Now let it be assumed that the collector current $I_C$ of the transistor Q1 is 10 ($\mu$A), and the current amplification factor $\beta$ of said transistor Q1 is 10. Then the base current of the transistor Q1 stands at $I_C/\beta = 1$ ($\mu$A). Further, if it is assumed that the aforementioned high resistance element RH has a resistance of 100 k$\Omega$, then the voltage appearing across both ends of said high resistance element RH rises as high as $100(k\Omega) \times 1(\mu A) = 100$ (mV). Since such a prominent voltage drop appears across the output terminal in the form of offset voltage, great care should be taken in designing the captioned composite transistor circuit.

In this connection, a description may now be made with reference to FIG. 2 of a circuit which has already been proposed to equivalently elevate the current amplification factor $\beta$ of the noninverted side transistor in order to reduce the base current appearing at the noninverted input terminal 13 of the differential amplifier so as to minimize voltage drop. With this proposed circuit, a PNP transistor Q6 is Darlington connected to a transistor Q1. Further, a PNP transistor Q7 is also Darlington connected to a transistor Q2. The above-mentioned Darlington connection is intended to attain a balance between the inverted and noninverted sides of the aforesaid differential amplifier.

Discussion may now be made of a voltage drop occurring across both ends of the high resistance element RH provided on the noninverted side of the aforementioned differential amplifier. Now let it be assumed that $I_{CQ1}$ shows the collector current of a transistor Q1; $I_{BQ1}$ denotes the base current of said transistor Q1; $I_{EQ6}$ represents the emitter current of a transistor Q6; $I_{CQ6}$ sets forth the collector current of said transistor Q6; and $I_{BQ6}$ shows the base current of said transistor Q6. Further, let it be supposed that the current amplification factor $\beta$ of both transistors Q1, Q6 are represented by $\beta_P$ alike. In this case $I_{BQ1}$ is expressed as:

$$I_{BQ1} = \frac{I_{CQ1}}{\beta_P} = I_{EQ6}$$

The following formula is generally accepted:

$$I_E \approx I_C$$

Therefore, $I_{EQ6} \approx I_{CQ1}$ $$I_{BQ6} = \frac{I_{CQ6}}{\beta_P} = \frac{1}{\beta_P} \times \frac{I_{CQ1}}{\beta_P} = \frac{I_{CQ1}}{(\beta_P)^2} \quad (1)$$

Therefore,
As seen from the above formula (1), the base current of the transistor Q6 corresponds to $1/(\beta_P)^2$ of the collector current of the transistor Q1. If, therefore, the transistors Q1, Q6 are assumed to jointly constitute one composite transistor, then the amplifying factor $\beta$ of said composite transistor may be equivalently expressed as $(\beta_P)^2$, providing that the amplifying factor $\beta$ is increased over that of the circuit of FIG. 1.

Further referring to FIG. 2 representing another prior art, a description may now be made of a voltage drop occurring across both ends of the resistor RH connected to the noninverted input terminal. As in the circuit of FIG. 1, the following assumption ia made:

$$I_{CQ1} = 10(\mu A)$$

The amplification factor $\beta$ of the transistors Q1, Q6 = 10. Then, the base current $I_B$ of the composite transistors Q1, Q6 is expressed as:

$$I_B = I_{BQ6} = \frac{I_{CQ1}}{(\beta_P)^2} = \frac{10 \times 10^{-6}}{(10)^2} = 0.1 \ (\mu A).$$

Therefore, RH = 100 (k$\Omega$) connected to the noninverted input terminal of the differential amplifier is expressed as:

$$100 \ (k\Omega) \times I_B = 100 \ (k\Omega) \times 0.1 \ (\mu A)$$
$$= 10 \ (mV)$$

The above formula is also applicable to a voltage drop occurring across both ends of a high resistance element (not shown) provided on the inverted side of the differential amplifier. Assuming, therefore, that the Darlington connection is provided as shown in FIG. 2, it is possible to reduce the base currents supplied to the noninverted and inverted input terminals to such an extent as can be overlooked (that is, to equivalently increase the amplification factor $\beta$ of the transistor). Namely, the prior art circuit of FIG. 2 is more improved than that of FIG. 1

If the amplification factor $\beta$ is fixed in the prior art circuit of FIG. 1, the base current of the transistor Q1 can be decreased by reducing the reference current $I_{O1}$. In such a case, however, it is impossible to obtain sufficient drive current to actuate the transistor Q5. The prior art circuit of FIG. 1 has the drawback that since the base current component of the transistor Q1 increases to such a large extent as can not be overlooked, said circuit of FIG. 1 can not be applied as a high input impedance circuit. Now referring again to the prior art circuit of FIG. 2, if an input transistor is Darlington connected to another transistor, then said composite transistor circuit can allow for the passage of a large reference current $I_{O1}$ required to produce a sufficient drive current to actuate the transistor Q5. In this case, it is also possible to reduce the base current of the transistor Q6. However, the prior art transistor circuit of FIG. 2, where an equivalent base-emitter voltage is twice as large as that in FIG. 1, is not adapted to be used as a circuit requiring a minimum (−0.9 V) drive source voltage.

The merits and demerits of the prior arts of FIGS. 1 and 2 may be summarized as in the following table.

| Merits and demerits | FIG. 1 | FIG. 2 |
| --- | --- | --- |
| Drive capacity obtained by a small reference current $I_{O1}$ | Insufficient | Sufficient |
| Effect exerted by a base current running through a noninverted input terminal | Large | Small |
| Operation under the ordinary minimum source voltage ($V_{CCmin} = 0.9$ V) | Good | Not good |

SUMMARY OF THE INVENTION

This invention has been accomplished to cope with the aforementioned circumstances, and is intended to equivalently elevate the current amplification factor $\beta$ of a transistor provided on the noninverted side, namely, to decrease the base current of the transistor and minimize the effect exerted by the base current on the circuit output, thereby providing a composite transistor circuit applicable as a high input impedance circuit.

Another object of the invention is to provide a composite transistor circuit, which, if provided on the noninverted input terminal side of a differential amplifier, (or possibly on both the noninverted and inverted terminal sides) can reduce the aforementioned base current, even if a minimum reference current required to drive an output transistor has to be increased, and minimize the effect exerted by the base current on the output, and is further applicable as a circuit requiring a minimum operation source voltage $V_{CCmin}$ of 0.9.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the composite transistor of this invention comprises an input transistor of a first polarity whose emitter is connected to a first power source; a first current mirror circuit formed of transistors of a second polarity; the first current mirror circuit comprising a first reference current circuit and a first output current circuit and producing an output current bearing a first predetermined ratio to the first reference current; and wherein one end of said first reference current circuit is connected to the collector of said input transistor; and the other end of said first reference current circuit and one end of said first output current circuit are connected to a second power source; and a second current mirror circuit formed of transistors of the first polarity; the second current mirror circuit comprising a second reference current circuit and a second output current circuit and producing an output current bearing a second predetermined ratio to a second reference current; and wherein one end of said second reference current circuit is connected to the other end of said first output current circuit; the other end of said second reference current circuit and one end of said second output current circuit are connected to the emitter of said input transistor; and the other end of the second output current circuit is connected to an output terminal of the composite transistor circuit; whereby said input transistor, first current mirror circuit and a second current mirror circuit equivalently constitute a composite transistor whose base, emitter and collector are respectively constituted, as equivalently viewed, by the base and emitter of the first transistor and the other end of the second output current circuit.

The accompanying drawings, which are incorporated in and constitute a part of this specification, illustrate embodiments of the invention and, together with the description, serve to explain the principles of the invention.

BRIEF DESCRIPTION OF THE DREAWINGS

FIGS. 1 and 2 denote the conventional differential amplifier circuits;

FIG. 10 illustrates the various notations showing resistance, current and voltage which are supplied to the circuit of FIG. 9;

FIGS. 11A and 11B are the modifications of the current mirror circuit 21 of FIG. 8;

Figure 8:
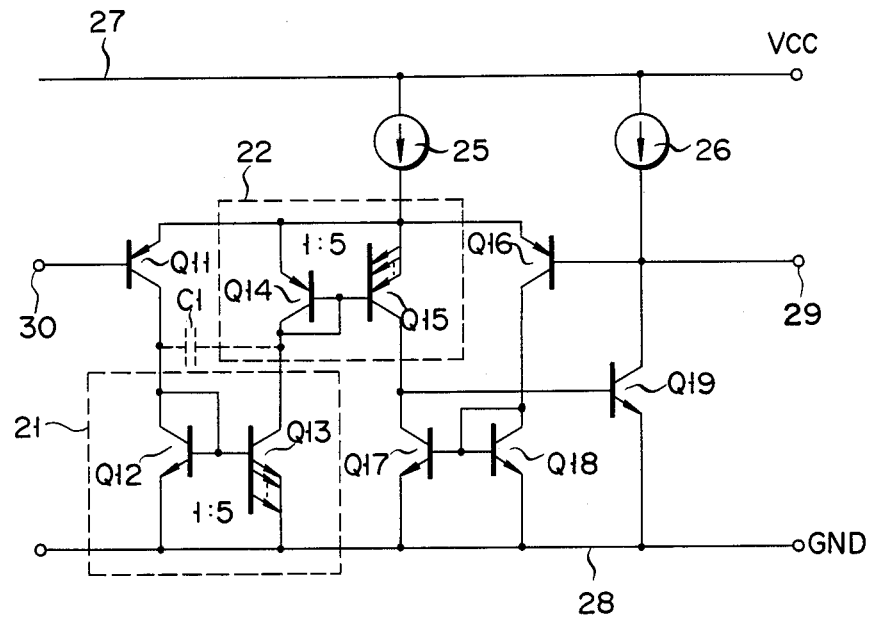
FIG. 8 illustrates the arrangement in which the fundamental circuit of FIG. 3 embodying this invention is applied to a differential amplifier.

FIGS. 12A and 12B denote the modifications of the current mirror circuit 22 of FIG. 8; and FIG. 13 represents the arrangement of a composite transistor circuit according to another embodiment of this invention.

DETAILED DESCRIPTION OF THE PREFERRED EMBODIMENTS

Description may now be made with reference to the accompanying drawings of composite transistor circuits according to the various embodiments of this invention.

Figure 3:
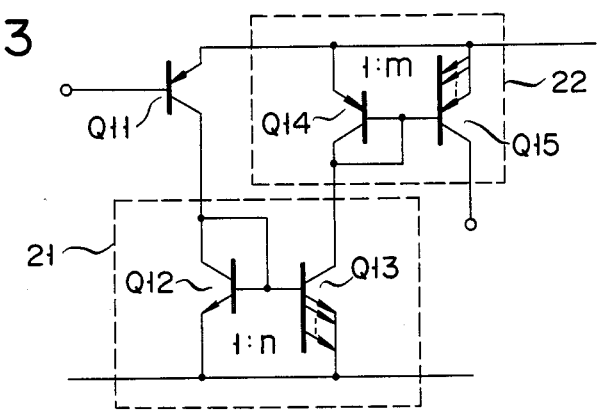
FIG. 3 shows the fundamental arrangement of a composite transistor circuit embodying this invention.

First, the fundamental concept of the invention is explained below. Referring to FIG. 3, first and second current mirror circuits 21, 22 are respectively connected to the collector and emitter sides of an input PNP transistor Q11. The emitter of the transistor Q11 is connected to a first power source. The first current mirror circuit 21 consists of an NPN transistor Q12 provided on the reference current side and an NPN transistor Q13 provided on the output current side. The emitters of the transistors Q12 and Q13 are connected to a second power source. The collector-emitter path of the transistor Q12 constitutes the reference current circuit of the current mirror circuit 21. The collector-emitter path of the transistor Q13 constitutes the current output circuit of the current mirror circuit 21. The ratio between the reference current and output current is defined to be 1:n (n>0).

The transistor Q13 provided on the output current side of the first current mirror circuit is connected to the reference current side of the second current mirror circuit 22, namely, a PNP transistor Q14. The second current mirror circuit 22 is composed of said PNP transistor Q14 and a PNP transistor Q15 provided on the output current side. The ratio between the reference current and output current is set at 1:m (m>0). Connected to the emitter of the transistor Q11 are the emitters of the transistors Q14, Q15. The collector-emitter path of the transistor Q14 constitutes a reference current circuit of the current mirror circuit 22. The collector-emitter path of the transistor Q15 constitutes an output current circuit of the current mirror circuit 22. In this embodiment, the ratios are different. However, the ratios may be the same.

Figure 1:
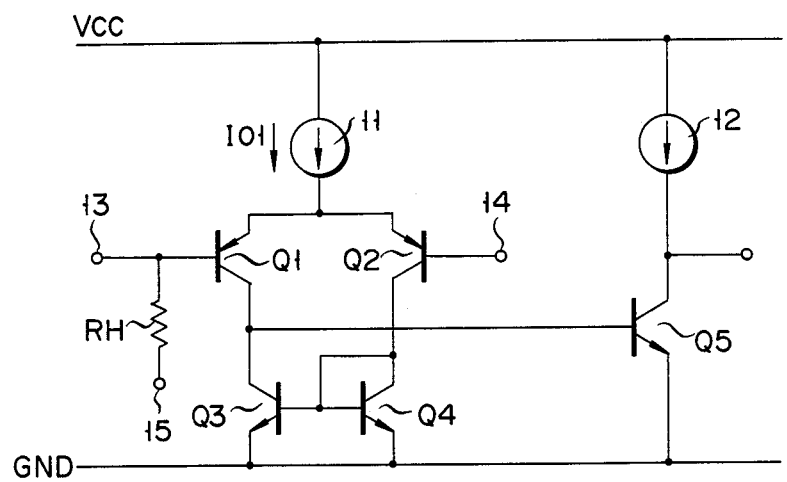
Figure 2:
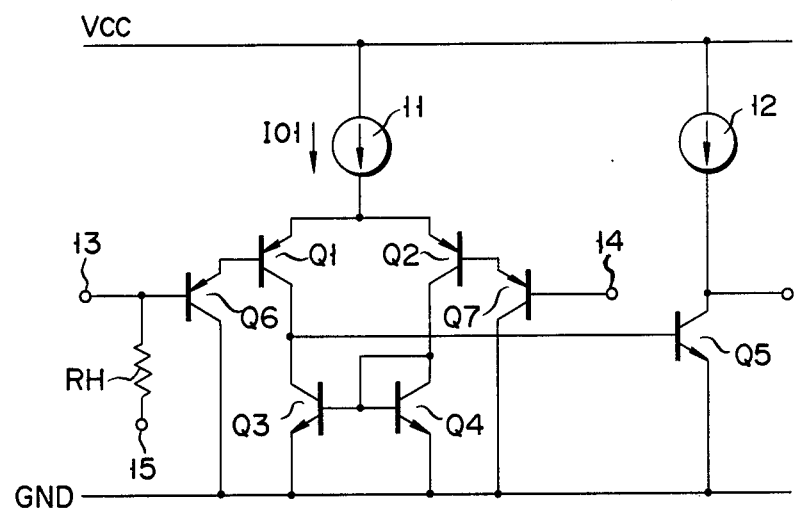
Figure 5:
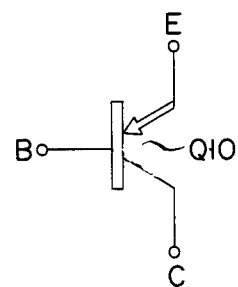
Figure 6:
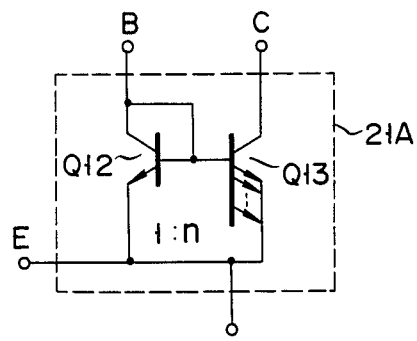
FIG. 6 is an equivalent circuit of FIG. 3.
Figure 7:
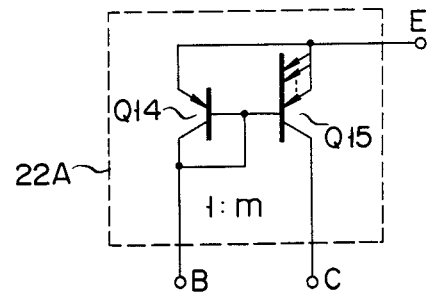
FIG. 7 is an equivalent circuit of FIG. 6.

As equivalently viewed, the current mirror circuits 21, 22 shown in FIG. 3 may respectively be regarded as the composite transistor circuits 21A, 22A indicated in FIGS. 6 and 7. Consequently the prior art composite transistor circuit of FIG. 1 may be remodeled into that of FIG. 4. Namely, the first and second current mirror circuits 21A, 22A may respectively be regarded as composite transistor circuits Q23, Q45. Further, if viewed as one transistor, the circuit of FIG. 4 may be deemed as a single composite transistor Q10 set forth in FIG. 5.

Now let it be assumed that a ratio between the areas of the transistors Q12, Q13 constituting the first current mirror circuit 21 is 1:n; and that a ratio between the areas of the transistors Q14, Q15 constituting the second current mirror circuit 22 indicates 1:m. Then, the equivalent current amplification factor $\beta_1$ of the composite transistor circuit 21A of FIG. 6 may be determined to be $$\beta_1 = n$$

from the equation $I_{CQ13} = n \times I_{CQ12}$ (where $I_{CQ12}$ denotes the collector current of the transistor Q12 and $I_{CQ13}$ represents the collector current of the transistor Q13.) The equivalent current amplification factor $\beta_2$ of the composite transistor circuit 22A of FIG. 7 may be determined to be $$\beta_2 = m$$

from the equation $I_{CQ15} = m \times I_{CQ14}$ (where $I_{CQ15}$ shows the collector current of the transistor Q15 and $I_{CQ14}$ indicates the collector current of the transistor Q14). Now, let the following assumption be made with respect to FIG. 4:

$I_{BQ11}$ = base current of transistor Q11
$I_{CQ11}$ = collector current of transistor Q11
$I_{BQ23}$ = base current of composite transistor circuit Q23
$I_{BQ45}$ = base current of composite transistor circuit Q45
$I_{CQ45}$ = collector current of composite transistor circuit Q11
$\beta_P$ = equivalent amplification factor of transistor Q11
$\beta_1$ = equivalent amplification factor of composite transistor circuit Q23
$\beta_2$ = equivalent amplification factor of composite transistor circuit Q45 Then the following relationships result:

$$I_{CQ11} = \beta_P \times I_{BQ11} \quad (2)$$
$$I_{BQ23} = I_{CQ11} \quad (3)$$
$$I_{CQ23} = \beta_1 \times I_{BQ23} \; (\beta_1 = n) \quad (4)$$
$$I_{BQ45} = I_{CQ23} \quad (5)$$
$$I_{CQ45} = \beta_2 \times I_{BQ45} \; (\beta_2 = m) \quad (6)$$

$$\begin{aligned}
\therefore I_{CQ45} &= \beta_2 \times I_{BQ45} = \beta_2 \times I_{CQ23} = \beta_2 \times (\beta_1 \times I_{BQ23}) \\
&= \beta_2 \times (\beta_1 \, \beta \, I_{CQ11}) \\
&= \beta_2 \times \{\beta_1 \times (\beta_P \times I_{BQ11})\} \\
&= \beta_2 \cdot \beta_1 \cdot \beta_P \cdot I_{BQ11} \\
&= m \cdot n \cdot \beta_P \cdot I_{BQ11}
\end{aligned} \quad (7)$$

Figure 4:
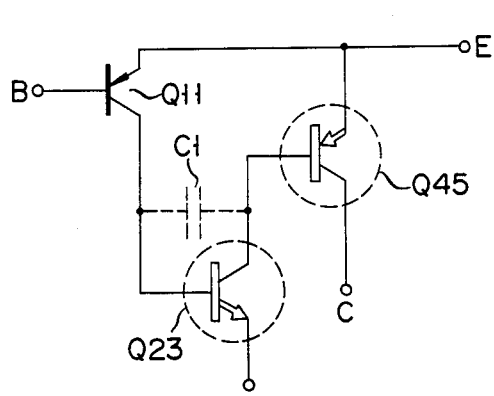
FIGS. 4 and 5 show the parts of the circuit of FIG. 3.

If the circuit of FIG. 4 is rearranged from the above equation (7) into the composite transistor circuit Q10 of FIG. 5, then the equivalent amplification factor $\beta$ of said circuit Q10 will assume as large a value as $m \cdot n \cdot \beta_P$, thereby reducing the base current. If however, the ratio 1:n between the areas of the transistors Q12 and Q13 constituting the current mirror circuit 21 is allowed to have an excessively large value, then said current mirror circuit 21 will unduly increase in the loop gain, thus sometimes causing oscillation. To avoid this objectionable event, it is advised to provide a capacitor C1 indicated in broken lines in FIG. 4.

As seen from the foregoing description of the circuit arrangement, the present invention can equivalently elevate the current amplification factor $\beta$ of a composite transistor circuit Q10, namely, decrease the base current and minimize the effect of the base current, thereby providing a high impedance current.

Description may now be made with reference to FIG. 8 of the fundamental circuit of FIG. 3 concretely applied to a differential amplification circuit, with the same parts throughout FIGS. 3 to 7 denoted by the same reference numerals. Reference numerals 25, 26 respectively represent first and second reference current sources. Reference numeral 27 denotes a first bias current source line; reference numeral 28 shows a second bias current source line; reference numeral 30 indicates a noninverted input terminal; and reference numeral 29 denotes an output terminal. If the circuit of FIG. 8, a composite transistor circuit embodying this invention is applied on the noninverted side of a differential amplifier.

Figure 9:
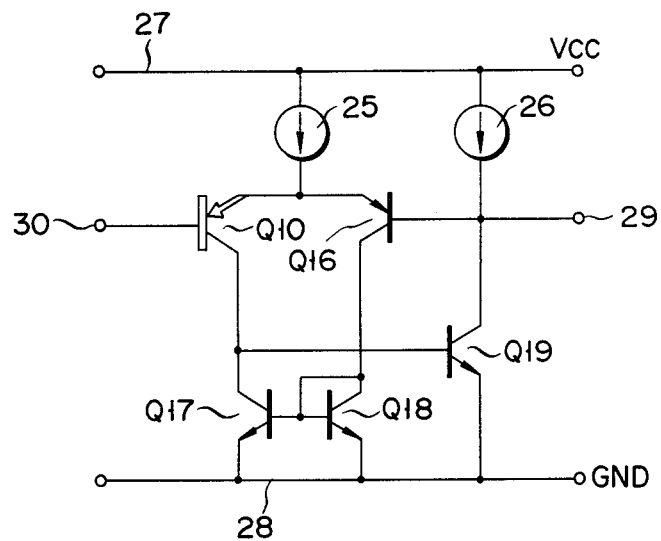
FIG. 9 is an equivalent circuit of FIG. 7.

The circuit of FIG. 8 may be remoduled into that of FIG. 9 in accordance with the aforementioned fundamental concept of the invention. Let the following assumption be made in determining the equivalent current amplification factor $\beta$ of the composite transistor circuit Q10 of FIG. 9.

Referring to FIG. 8, $I_{CQ11}$ = collector current of the transistor Q11
$I_{BQ11}$ = base current of the transistor Q11
$\beta_P$ = current amplification factor of the transistor Q11
$I_{CQ12}$ = collector current of the transistor Q12
$I_{BQ12}$ = base current of the transistor $Q_{12}$
$I_{CQ10}$ = collector current of the transistor Q10
$I_{BQ10}$ = base current of the transistor Q10
$\beta_{Q10}$ = current amplification factor of the transistor Q10
$I_{CQ13}$ = collector current of the transistor Q13
$I_{CQ15}$ = collector current of the transistor Q15

Now let the following assumption be made:

The current ratio 1:n of the first current mirror circuit = 1:5 and the current ratio 1:m of the second current mirror circuit=1:5. Then the following equations result:

$$I_{CQ13} = I_{CQ12} \times 5$$
$$I_{CQ15} = 5 \times I_{CQ14}$$
Since $I_{CQ14} = I_{CQ13}$
$$I_{CQ12} = I_{CQ11}$$
$$I_{CQ10} = I_{CQ15}$$
$$I_{BQ10} = I_{BQ11}$$
$$I_{BQ11} = I_{CQ11}/\beta_P,$$
therefore $$I_{CQ15} = 5 \times I_{CQ14} = 5 \times I_{CQ13} = 5 \times (5 \times I_{CQ12}) \quad (8)$$
$$= 25 \times I_{CQ11} = 25 \times \beta_P \times I_{BQ11}$$
$$I_{CQ10} = I_{BQ10} \times 25 \times \beta_P$$

Consequently, the equivalent current amplification factor $\beta_{Q10}$ of the composite transistor Q10 may be expressed as follows:

$$\beta_{Q10} = 25 \times \beta_P \quad (8)'$$

Discussion may now be made of the operation of the circuits of FIGS. 8 and 9. In this connection, the following case is assumed:

As shown in FIG. 10, the base of the transistor Q16 provided on the inverted side is coupled to an AC-ground;

A load resistor $R_L$ is connected to the output terminal 29;

An input Vin is supplied to a noninverted input terminal 30; and

The input impedance is represented by Rin; and

The open loop gain is denoted by $A_{VO}$. Further, let it be supposed that at this time a signal current i is supplied from the emitter of the transistor Q16 to the emitter of the transistor Q10, thereby reducing the voltage of the noninverted input terminal. In this case, the direction in which the current flows to the collector side of the transistor Q10 is taken as positive. This means that a signal current $-i$ is conducted from the collector of the transistor Q16 to that of the transistor Q18. Therefore, a signal current 2i may be assumed to run from the base of a transistor Q19 to point S indicated in FIG. 10.

Now determination is made of the emitter resistances re10, re16 of the transistors Q10, Q16. Generally, a relationship expressed by the following formula $re = V_T/I_C$ ($V_T$ denotes a thermal voltage) exists between the emitter resistance "re" of the transistor and the direct current $I_C$ flowing through the collector of said transistor. The base current component $I_{BQ19}$ of the transistor Q19 is so similar to the current of the reference current source $I_{O1}$ that the difference can be overlooked. Consequently it can be assumed that an equal direct current $I_{O1}/2$ passes through the collectors of the transistors Q10, Q16.

Therefore, $$re10 = re16 = \frac{V_T}{\frac{I_{O1}}{2}} = \frac{2V_T}{I_{O1}} \quad (9)$$

The following relationship exists between the input signal voltage Vin and signal current i $$V_{in} = i \times re10 + i \times re16 = i\left(2 \times \frac{2V_T}{I_{O1}}\right) = \frac{4V_T}{I_{O1}} i \quad (10)$$

Since the input current Iin brought to the noninverted terminal is expressed as $I_{in} = i_{bQ10}$ ($i_{bQ10}$ denotes a signal current component appearing at the base of the transistor Q10), the following equation results from the aforementioned equation (8)

$$I_{in} = i_{bQ10} = \frac{i_{Q10}}{\beta_{Q10}} \quad (11)$$

(where $i_{Q10}$ represents a signal current component produced at the collector of the transistor Q10). When, therefore, the equation (8) is substituted in the above equation (11), the following formula results:

$$R_{in} = \frac{V_{in}}{I_{in}} = \frac{\frac{4V_T}{I_{O1}}}{\frac{i}{25 \times \beta_P}} \quad (12)$$

$$= \frac{4V_T}{I_{O1}} \times 25 \times \beta_P$$

Thus, the input impedance Rin is expressed:

$$I_{in} = \frac{i_{Q10}}{\beta_{Q10}} = \frac{1}{25 \times \beta_P}$$

Since the transistor Q19 acts as an emittergrounded amplifier, a signal current $i_{Q19}$ flowing through the collector of the transistor Q19 is expressed as $2i \times \beta_{Q19}$. This signal current $2i \times \beta_{Q19}$ runs from the load resistor $R_L$ to the collector of the transistor Q19. Now assuming that $\beta_N$ represents the current amplification factor of the NPN transistor Q19, the following equation results:

$$\beta_{Q19} = \beta_N$$

Therefore, $i_{Q19}$ is expressed as:

$$i_{Q19} = 2 i \beta_N \quad (13)$$

Thus, the output voltage Vout is expressed as follows from the above equation (13):

$$V_{out} = -2i \times \beta_N \times R_L \quad (14)$$

In the equation (13), the item 2i has negative character. This is because the current 2i flows from ground to the output terminal 29, as shown FIG. 10. Though the above-mentioned output voltage Vout has a potential negative to the previously described zero AC potential, the input signal voltage Vin also has a negative potential. Therefore, it is seen that the input and output have the same phase, thus ensuring a noninverted amplification.

The voltage gain (open gain $A_{VO}$) of the differential amplifier of this invention (FIG. 8) may be expressed as follows from the aforementioned equations (10), (14):

$$A_{VO} = \left|\frac{V_{out}}{V_{in}}\right| = \frac{2i \times \beta_N \times R_L}{\frac{4V_T}{I_{O1}} i} \quad (15)$$

$$= \frac{I_{O1} \times \beta_N \times R_L}{2V_T}$$

The aforementioned equation (12) clearly shows that if applied as part of a differential amplifier circuit, the composite transistor circuit of this invention can act as a high input impedance circuit. It is also evident from the equation (8) that a base current component can be very much reduced at the input terminal of said differential amplifier circuit. Further, the differential amplifier circuit of FIG. 8 arranged as described above can be easily operated with a minimum drive source voltage $V_{CCmin}=0.9$ (V). It is also obvious that the input impedance of the aforementioned differential amplifier circuit and the base current at the input terminal of said circuit can be varied with the current ratio of the current mirror circuit involved in the composite transistor circuit.

It is evident from FIG. 11A that the current mirror circuit 21 of FIG. 8 can have its current ratio freely determined by selecting the emitter resistance R of the transistor Q12. FIG. 11B indicates that the current ratio of the current mirror circuit 21 can be freely determined by selecting the area ratio of the transistors Q12, Q13 and the emitter resistances R1, R2 of the transistors Q12, Q13. If, however, the current mirror circuit 21 of FIGS. 11A, 11B and FIG. 8 are allowed to have an excessively large current ratio, then said current mirror circuit 21 tends to start oscillating. If, in such a case, a capacitor C1 (indicated by broken lines) is provided between the transistors Q12 and Q13 shown in FIGS. 11A and 11B, then said oscillation can be prevented. With respect to FIGS. 12A and 12B, the current ratio of the current mirror circuit 22 of FIG. 8 can be freely determined by properly selecting the emitter resistance R and area ratios of the transistors Q14, Q15.

If, in FIG. 10, the areas of the transistor Q10 and the transistor Q16 are equivalently allowed to have a ratio of 25:1, then a difference $\Delta V_{BE}$ between the base-emitter voltages of said transistors Q10, Q16 may be expressed as follows:

$$\Delta V_{BE} = V_T ln 25 = 26 \times ln 25 = 84 \text{ (mV)} \quad (16)$$

Namely, the circuit of FIG. 10 can be applied as a differential amplifier having such an initial bias as expressed by the above equation (16).

FIG. 13 illustrates a voltage follower circuit in which the composite transistor circuit of this invention is applied as the terminal units of the noninverted and inverted sides of a differential amplifier. In the embodiment of FIG. 13, too, the transistors Q20, Q21 jointly constitute a current mirror circuit, and the transistors Q22, Q23 collectively represent a current mirror circuit.

What is claimed is:

1. A composite transistor circuit which comprises:
   an input transistor of a first polarity whose emitter is connected to a first power source;
   a first current mirror circuit formed of transistors of a second polarity; the first current mirror circuit comprising a first reference current circuit and a first output current circuit and producing an output current bearing a first predetermined ratio to first reference current; and wherein one end of said first reference current circuit is connected to the collector of said input transistor; and the other end of said first reference current circuit and one end of said first output current circuit are connected to a second power source; and
   a second current mirror circuit formed of transistors of the first polarity; the second current mirror circuit comprising a second reference current circuit and a second output current circuit and producing an output current bearing a second predetermined ratio to a second reference current; and wherein one end of said second reference current circuit is connected to the other terminal of said first output current circuit; the other end of said second reference current circuit and one end of said second output current circuit are connected to the emitter of said input transistor; and the other end of the second output current circuit is connected to an output terminal of the composite transistor circuit;
   whereby said input transistor, first current mirror circuit and a second current mirror circuit equivalently constitute a composite transistor whose base, emitter and collector are respectively constituted, as equivalently viewed, by the base and emitter of the first transistor and the other end of the second output current circuit.

2. The composite transistor circuit according to claim 1, wherein said first predetermined ratio of an output current and said second predetermined ratio of an output current are substantially the same.

3. The composite transistor circuit according to claim 1, wherein said first predetermined ratio of an output current and said second predetermined ratio of an output current are different.

4. A differential amplifier circuit comprising:
   a composite transistor circuit for receiving a first input signal, said composite transistor circuit comprising:
   a first input transistor of a first polarity for receiving said first input signal, the emitter of said first input transistor being connected to a first power source;
   a first current mirror circuit formed of transistors of a second polarity, said first current mirror circuit comprising a first reference current circuit and a first output current circuit and producing an output current bearing a first predetermined ratio to a first reference current, and wherein one end of said first reference current circuit is connected to the collector of said first input transistor, and the other end of said first reference current circuit and one end of said first output current circuit are connected to a second power source; and
   a second current mirror circuit formed of transistors of said first polarity, said second current mirror circuit comprising a second reference current circuit and a second output current circuit and producing an output current bearing a second predetermined ratio to a second reference current, and wherein one end of said second reference current circuit is connected to the other end of said first output current circuit, and the other end of said second reference current circuit and one end of said second output current circuit are connected to the emitter of said first input transistor and said first power source;
   a second input transistor of said first polarity for receiving a second imput signal, the emitter of said second input transistor being connected to said first power source; and
   a third current mirror circuit formed of transistors of said second polarity, said third current mirror circuit comprising a third reference current circuit and a third output current circuit and producing an output current bearing a third predetermined ratio to a third reference current, and wherein one end of said third reference current circuit is connected to the collector of said second input transistor, and the other end of said third reference current circuit and one end of said third output current circuit are connected to said second power source and the other end of said third output current circuit is connected to the other end of said second output current circuit.

5. A voltage follower circuit comprising:

a first composite transistor circuit for receiving a first input signal, said first composite transistor circuit comprising:

a first input transistor of a first polarity for receiving said first input signal, the emitter of said first input transistor being connected to a first power source;

a first current mirror circuit formed of transistors of a second polarity, said first current mirror circuit comprising a first reference current circuit and a first output current circuit and producing an output current having a first predetermined ratio to a first reference current, and wherein one end of said first reference current circuit is connected to the collector of said first input transistor, and the other end of said first reference current circuit and one end of said first output current circuit are connected to a second power source; and a second current mirror circuit formed of transistors of said first polarity, said second current mirror circuit comprising a second reference current circuit and a second output current circuit and producing an output current having a second predetermined ratio to a second reference current, and wherein one end of said second reference current circuit is connected to the other end of said first output current circuit, and the other end of said second reference current circuit and one end of said second output current circuit are connected to the emitter of said first input transistor and said first power source;

a second composite transistor circuit for receiving a second input signal, said second composite transistor circuit comprising:

a second input transistor of said first polarity for receiving said second input signal, the emitter of said second input transistor being connected to said first power source;

a third current mirror circuit formed of transistors of said second polarity, said third current mirror circuit comprising a third reference current circuit and a third output current circuit and producing an output current having a third predetermined ratio to a third reference current, and wherein one end of said third reference current circuit is connected to the collector of said second input transistor, and the other end of said third reference current circuit and one end of said third output current circuit are connected to said second power source; and a fourth current mirror circuit formed of transistors of said first polarity, said fourth current mirror circuit comprising a fourth reference circuit and a fourth output current circuit and producing an output current having a fourth predetermined ratio to a fourth reference current, and wherein one end of said fourth reference current circuit is connected to the other end of said third output current circuit, and the other end of said fourth reference current circuit and one end of said fourth output current circuit are connected to the emitter of said second input transistor and said first power source; and a fifth current mirror circuit formed of transistors of said second polarity, said fifth current mirror circuit comprising a fifth reference current circuit and a fifth output current circuit and producing an output current having a fifth predetermined ratio to a fifth reference current, and wherein one end of said fifth reference current circuit is connected to the other end of said second output current circuit, one end of said fifth output current circuit is connected to the other end of said fourth output current circuit, and the other end of said fifth reference and output current circuits are connected to said second power source.

* * * * *

UNITED STATES PATENT AND TRADEMARK OFFICE
CERTIFICATE OF CORRECTION

PATENT NO. : 4,620,161

DATED : October 28, 1986

INVENTOR(S) : Tatsuo Tanaka et al.

It is certified that error appears in the above-identified patent and that said Letters Patent is hereby corrected as shown below:

On the Title Page, Item [73] Assignee: "Inc." should read --- Ltd.---.

Signed and Sealed this

Seventh Day of April, 1987

Attest:

DONALD J. QUIGG

*Attesting Officer*  *Commissioner of Patents and Trademarks*